United States Patent
Shaw

(10) Patent No.: US 10,211,694 B1
(45) Date of Patent: Feb. 19, 2019

(54) STRUCTURES AND METHODS FOR THERMAL MANAGEMENT IN PRINTED CIRCUIT BOARD STATORS

(71) Applicant: E-Circuit Motors, Inc., Newton, MA (US)

(72) Inventor: Steven Robert Shaw, Bozeman, MT (US)

(73) Assignee: E-Circuit Motors, Inc., Newton, MA (US)

( * ) Notice: Subject to any disclaimer, the term of this patent is extended or adjusted under 35 U.S.C. 154(b) by 0 days.

(21) Appl. No.: 16/165,829

(22) Filed: Oct. 19, 2018

Related U.S. Application Data

(63) Continuation of application No. 15/852,972, filed on Dec. 22, 2017, which is a continuation-in-part of application No. 15/611,359, filed on Jun. 1, 2017, now Pat. No. 9,859,763, which is a continuation-in-part of application No. 15/283,088, filed on Sep. 30, 2016, now Pat. No. 9,800,109, which
(Continued)

(51) Int. Cl.
| | | |
|---|---|---|
| *H01K 3/26* | (2006.01) | |
| *H02K 3/26* | (2006.01) | |
| *H02K 1/27* | (2006.01) | |
| *H02K 3/50* | (2006.01) | |
| *H05K 1/02* | (2006.01) | |
| *H02K 1/18* | (2006.01) | |
| *H02K 21/24* | (2006.01) | |

(52) U.S. Cl.
CPC ............ *H02K 3/26* (2013.01); *H02K 1/182* (2013.01); *H02K 1/27* (2013.01); *H02K 3/50* (2013.01); *H02K 21/24* (2013.01); *H05K 1/0298* (2013.01)

(58) Field of Classification Search
CPC ............ H02K 3/26; H02K 21/24; H02K 1/27; H02K 3/50; H02K 1/182; H05K 1/0298
USPC .................................................. 310/179–210
See application file for complete search history.

(56) References Cited

U.S. PATENT DOCUMENTS

| 2,970,238 A | 1/1961 | Swiggett |
|---|---|---|
| 3,096,455 A | 7/1963 | Hahn |

(Continued)

FOREIGN PATENT DOCUMENTS

| CN | 103001426 A | 3/2013 |
|---|---|---|
| CN | 104426263 A | 3/2015 |

(Continued)

OTHER PUBLICATIONS

International Search Report and Written Opinion for Application No. PCT/US2016/054794, dated Jan. 4, 2017.
(Continued)

*Primary Examiner* — Naishadh N Desai
(74) *Attorney, Agent, or Firm* — Pierce Atwood LLP

(57) ABSTRACT

A stator for a motor or generator including a planar composite structure (PCS) having at least one dielectric layer and a plurality of conductive layers is provided. The stator includes first conductive elements extending radially to a distance $r_1$ from a center of, and disposed angularly on, the PCS. Each first conductive element includes a preferred termination structure to connect with at least one of a plurality of second conductive elements extending radially from a radius $r_2$ from the center of, and disposed angularly on, the PCS.

20 Claims, 14 Drawing Sheets

Related U.S. Application Data is a continuation-in-part of application No. 15/199,527, filed on Jun. 30, 2016, now Pat. No. 9,673,684, which is a continuation-in-part of application No. 15/208,452, filed on Jul. 12, 2016, now Pat. No. 9,673,688.

(60) Provisional application No. 62/530,552, filed on Jul. 10, 2017, provisional application No. 62/236,407, filed on Oct. 2, 2015, provisional application No. 62/236,422, filed on Oct. 2, 2015, provisional application No. 62/275,653, filed on Jan. 6, 2016.

(56) References Cited

U.S. PATENT DOCUMENTS

| | | |
|---|---|---|
| 3,944,857 A | 3/1976 | Faulhaber et al. |
| 4,115,915 A | 9/1978 | Godfrey |
| 4,658,162 A | 4/1987 | Koyama et al. |
| 4,677,332 A | 6/1987 | Heyraud |
| 4,733,115 A * | 3/1988 | Barone .......... H02K 3/26 310/184 |
| 4,804,574 A | 2/1989 | Osawa et al. |
| 5,099,162 A | 3/1992 | Sawada |
| 5,126,613 A | 6/1992 | Choi |
| 5,332,460 A | 7/1994 | Hosoya |
| 5,592,037 A | 1/1997 | Sickafus |
| 5,644,183 A | 7/1997 | Van Loenen et al. |
| 5,710,476 A | 1/1998 | Ampela |
| 5,952,742 A | 9/1999 | Stoiber et al. |
| 6,628,038 B1 | 9/2003 | Shikayama et al. |
| 7,109,625 B1 | 9/2006 | Jore et al. |
| 7,112,910 B2 | 9/2006 | Lopatinsky et al. |
| 7,301,428 B2 | 11/2007 | Suzuki et al. |
| 7,415,756 B2 | 8/2008 | Ishida et al. |
| 7,523,540 B2 | 4/2009 | Morel |
| 7,750,522 B2 | 7/2010 | Gizaw et al. |
| 7,812,697 B2 | 10/2010 | Fullerton et al. |
| 7,882,613 B2 | 2/2011 | Barthelmie et al. |
| 8,058,762 B2 | 11/2011 | Asano |
| 8,225,497 B2 | 7/2012 | Johnson et al. |
| 8,339,019 B1 | 12/2012 | Oyague |
| 8,362,731 B2 | 1/2013 | Smith et al. |
| 8,397,369 B2 | 3/2013 | Smith et al. |
| 8,400,038 B2 | 3/2013 | Smith et al. |
| 8,558,425 B2 | 10/2013 | Stahlhut et al. |
| 8,598,761 B2 | 12/2013 | Langford et al. |
| 8,692,637 B2 | 4/2014 | Richards et al. |
| 8,716,913 B2 | 5/2014 | Kvam et al. |
| 8,723,052 B1 | 5/2014 | Sullivan et al. |
| 8,723,402 B2 | 5/2014 | Oyague |
| 8,736,133 B1 | 5/2014 | Smith et al. |
| 8,785,784 B1 * | 7/2014 | Duford .......... H02K 3/26 174/255 |
| 8,823,241 B2 | 9/2014 | Jore et al. |
| 8,941,961 B2 | 1/2015 | Banerjee et al. |
| 9,013,257 B2 | 4/2015 | Steingroever |
| 9,154,024 B2 | 10/2015 | Jore et al. |
| 9,269,483 B2 | 2/2016 | Smith et al. |
| 9,479,038 B2 | 10/2016 | Smith et al. |
| 9,673,684 B2 * | 6/2017 | Shaw .......... H02K 9/22 |
| 2006/0055265 A1 | 3/2006 | Zalusky |
| 2006/0202584 A1 | 9/2006 | Jore et al. |
| 2007/0247014 A1 * | 10/2007 | Schach .......... H02K 23/02 310/184 |
| 2008/0067874 A1 | 3/2008 | Tseng |
| 2008/0100166 A1 | 5/2008 | Stahlhut et al. |
| 2009/0021333 A1 | 1/2009 | Fiedler |
| 2009/0072651 A1 | 3/2009 | Yan et al. |
| 2010/0000112 A1 | 1/2010 | Carow et al. |
| 2010/0123372 A1 | 5/2010 | Huang et al. |
| 2012/0033236 A1 | 2/2012 | Tsugimura |
| 2012/0041062 A1 | 2/2012 | Zhou et al. |
| 2012/0217831 A1 | 8/2012 | Jore et al. |
| 2012/0262019 A1 | 10/2012 | Smith et al. |
| 2012/0262020 A1 | 10/2012 | Smith et al. |
| 2013/0049500 A1 | 2/2013 | Shan et al. |
| 2013/0052491 A1 | 2/2013 | Bull et al. |
| 2013/0053942 A1 | 2/2013 | Kamel et al. |
| 2013/0072604 A1 | 3/2013 | Bowen, III et al. |
| 2013/0076192 A1 | 3/2013 | Tanimoto |
| 2013/0119802 A1 | 5/2013 | Smith et al. |
| 2013/0214631 A1 | 8/2013 | Smith et al. |
| 2013/0234566 A1 | 9/2013 | Huang et al. |
| 2014/0021968 A1 | 1/2014 | Lee |
| 2014/0021969 A1 | 1/2014 | Tseng et al. |
| 2014/0021972 A1 | 1/2014 | Barabi et al. |
| 2014/0028149 A1 | 1/2014 | Oyague |
| 2014/0042868 A1 | 2/2014 | Sullivan et al. |
| 2014/0152136 A1 | 6/2014 | Duford et al. |
| 2014/0175922 A1 | 6/2014 | Jore et al. |
| 2014/0201291 A1 | 7/2014 | Russell |
| 2014/0262499 A1 | 9/2014 | Smith et al. |
| 2014/0268460 A1 | 9/2014 | Banerjee et al. |
| 2014/0368079 A1 | 12/2014 | Wong et al. |
| 2015/0084446 A1 | 3/2015 | Atar |
| 2015/0188375 A1 | 7/2015 | Sullivan et al. |
| 2015/0188391 A1 | 7/2015 | Carron et al. |
| 2015/0311756 A1 | 10/2015 | Sullivan |
| 2015/0318751 A1 | 11/2015 | Smith et al. |
| 2016/0247616 A1 | 8/2016 | Smith et al. |
| 2016/0372995 A1 | 12/2016 | Smith et al. |
| 2017/0040878 A1 | 2/2017 | Smith et al. |
| 2017/0098973 A1 | 4/2017 | Shaw |
| 2017/0098982 A1 | 4/2017 | Shaw |

FOREIGN PATENT DOCUMENTS

| | | |
|---|---|---|
| CN | 105871089 A1 | 8/2016 |
| EP | 0563852 A1 | 10/1993 |
| EP | 2882079 A2 | 6/2015 |
| FR | 2262880 A1 | 9/1975 |
| GB | 2485185 A | 5/2012 |
| JP | 58036145 A | 3/1983 |
| JP | 59213287 A | 12/1984 |
| WO | 2004015843 A1 | 2/2004 |
| WO | 2004073365 A2 | 8/2004 |
| WO | 2009068079 A1 | 6/2009 |

OTHER PUBLICATIONS

International Search Report and Written Opinion for Application No. PCT/US2016/054704, dated Jan. 20, 2017.
International Search Report and Written Opinion for Application No. PCT/US20108/039500, dated Sep. 20, 2018.

* cited by examiner

STRUCTURES AND METHODS FOR THERMAL MANAGEMENT IN PRINTED CIRCUIT BOARD STATORS

CROSS-REFERENCE TO RELATED APPLICATIONS

This application is a continuation of and claims the benefit under 35 U.S.C. § 120 to U.S. patent application Ser. No. 15/852,972, entitled PLANAR COMPOSITE STRUCTURES AND ASSEMBLIES FOR AXIAL FLUX MOTORS AND GENERATORS, filed Dec. 22, 2017, and published as U.S. Patent Application Publication No. 2018-0138770 A1, which claims the benefit under 35 U.S.C. § 119(e) of U.S. Provisional Application Ser. No. 62/530,552, entitled STRUCTURES AND METHODS OF STACKING SUBASSEMBLIES IN PLANAR COMPOSITE STATORS TO OBTAIN HIGHER WORKING VOLTAGES, filed Jul. 10, 2017, and which is also a continuation-in-part of and claims the benefit under 35 U.S.C. § 120 to U.S. patent application Ser. No. 15/611,359, entitled STRUCTURES AND METHODS FOR CONTROLLING LOSSES IN PRINTED CIRCUIT BOARDS, filed Jun. 1, 2017, and now U.S. Pat. No. 9,859,763, which (A) is a continuation-in-part of and claims the benefit under 35 U.S.C. § 120 to U.S. patent application Ser. No. 15/283,088, entitled STRUCTURES AND METHODS FOR CONTROLLING LOSSES IN PRINTED CIRCUIT BOARDS, filed Sep. 30, 2016, and now U.S. Pat. No. 9,800,109, which is a continuation-in-part and claims the benefit under 35 U.S.C. § 120 to U.S. patent application Ser. No. 15/199,527, entitled STRUCTURES AND METHODS FOR THERMAL MANAGEMENT IN PRINTED CIRCUIT BOARD STATORS, filed Jun. 30, 2016, and now U.S. Pat. No. 9,673,684, and which also claims the benefit under 35 U.S.C. § 119(e) to each of U.S. Provisional Patent Application Ser. No. 62/236,407, entitled STRUCTURES TO REDUCE LOSSES IN PRINTED CIRCUIT BOARD WINDINGS, filed Oct. 2, 2015, and U.S. Provisional Patent Application Ser. No. 62/236,422, entitled STRUCTURES FOR THERMAL MANAGEMENT IN PRINTED CIRCUIT BOARD STATORS, filed Oct. 2, 2015, and (B) is a continuation-in-part of and claims the benefit under 35 U.S.C. § 120 to U.S. patent application Ser. No. 15/208,452, entitled APPARATUS AND METHOD FOR FORMING A MAGNET ASSEMBLY, filed Jul. 12, 2016, and now U.S. Pat. No. 9,673,688, which claims the benefit under 35 U.S.C. § 119(e) to U.S. Provisional Patent Application Ser. No. 62/275,653, entitled ALIGNMENT OF MAGNETIC COMPONENTS IN AXIAL FLUX MACHINES WITH GENERALLY PLANAR WINDINGS, filed Jan. 6, 2016. The contents of each of the foregoing applications, publications, and patents are hereby incorporated herein, by reference, in their entireties, for all purposes.

BACKGROUND

Field of Disclosure

Embodiments described herein are generally related to the field of thermal management in printed circuit board devices. More specifically, embodiments as disclosed herein are related to the field of thermal management in stators made on printed circuit boards for electric motors and generators.

Related Art

Current electric motors and other electric devices handling high currents through electrical leads in a printed circuit board (PCB) face multiple problems resulting from the large heat dissipation in the PCB. Some of the problems include warping of the substrate, which leads to mechanical failure and destructive mechanical interferences with the rotor of the motor or generator. Moreover, high temperature gradients in the PCB may lead to structural damage of the PCB such as delamination or localized failure of the electrical leads or the dielectric material in the substrate. The rare-earth magnets typically employed in airgap printed circuit board machines are also temperature sensitive. If the magnet temperature exceeds a specified value, the magnets can degrade and lose their magnetic field.

Printed circuit board electric machines built without the features described in this disclosure, i.e., the current state-of-the art, employ a variety of strategies to manage heat. Collectively, these strategies limit the commercial appeal and marketability of the basic printed circuit board stator design. These strategies include a) oversizing the machine relative to the desired mechanical operating portion so that the machine structure acts as a heat sink, b) actively cooling the machine, c) introduce efficiency compromising features such as larger air gaps between the rotor and the stator, d) limiting the machine to intermittent-duty applications, and/or e) equipping the machine with temperature-sensing controllers.

SUMMARY

In a first embodiment, a stator includes a planar composite structure (PCS) having at least one dielectric layer and a plurality of conductive layers, the PCS characterized at least in part by a center origin point and a periphery. The stator may also include a plurality of first conductive elements extending radially to a distance $r_1$ from the center origin point toward the periphery of the PCS and disposed angularly on the PCS, each first conductive element terminated in a preferred termination structure, and a plurality of second conductive elements extending radially from a radius $r_2$ from the center origin point toward the periphery of the PCS and disposed angularly on the PCS. Further, according to some embodiments, at least one of the first conductive elements is connected to at least one of the second conductive elements at the preferred termination structure according to a connection configuration.

In a second embodiment, a stator includes a PCS comprising at least one dielectric layer and at least one conductive layer, the PCS characterized at least in part by a center origin point and a periphery. The stator may also include a plurality of first conductive elements extending radially from a starting radius $r_0$ from the center origin point toward the periphery of the PCS and disposed angularly on the PCS, each first conductive element originating in a preferred starting structure. Further, the stator may include a plurality of second conductive elements extending radially from a radius $r_{-1}$ from the center origin point toward the center origin point of the PCS and disposed angularly on the PCS. In some embodiments, at least one of the first conductive elements is connected to at least one of the second conductive elements at the preferred starting structure according to a connection configuration.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Embodiments of the present disclosure differ from most in the broad area of printed circuit board thermal management in the sense that the heat originates in the PCB stator structure, and an objective of the embodiments of the disclosure is to convey that heat for the purpose of protecting the stator and surrounding components. Many advances in recent years focus on managing heat which originates in a sensitive component, and where structures on the printed circuit board are used as a heat sink, frequently with the objective of eliminating a costly discrete heat sink component. Embodiments of this disclosure are applicable to single and polyphase (e.g., three phase) motors and generators.

Figure 1A:
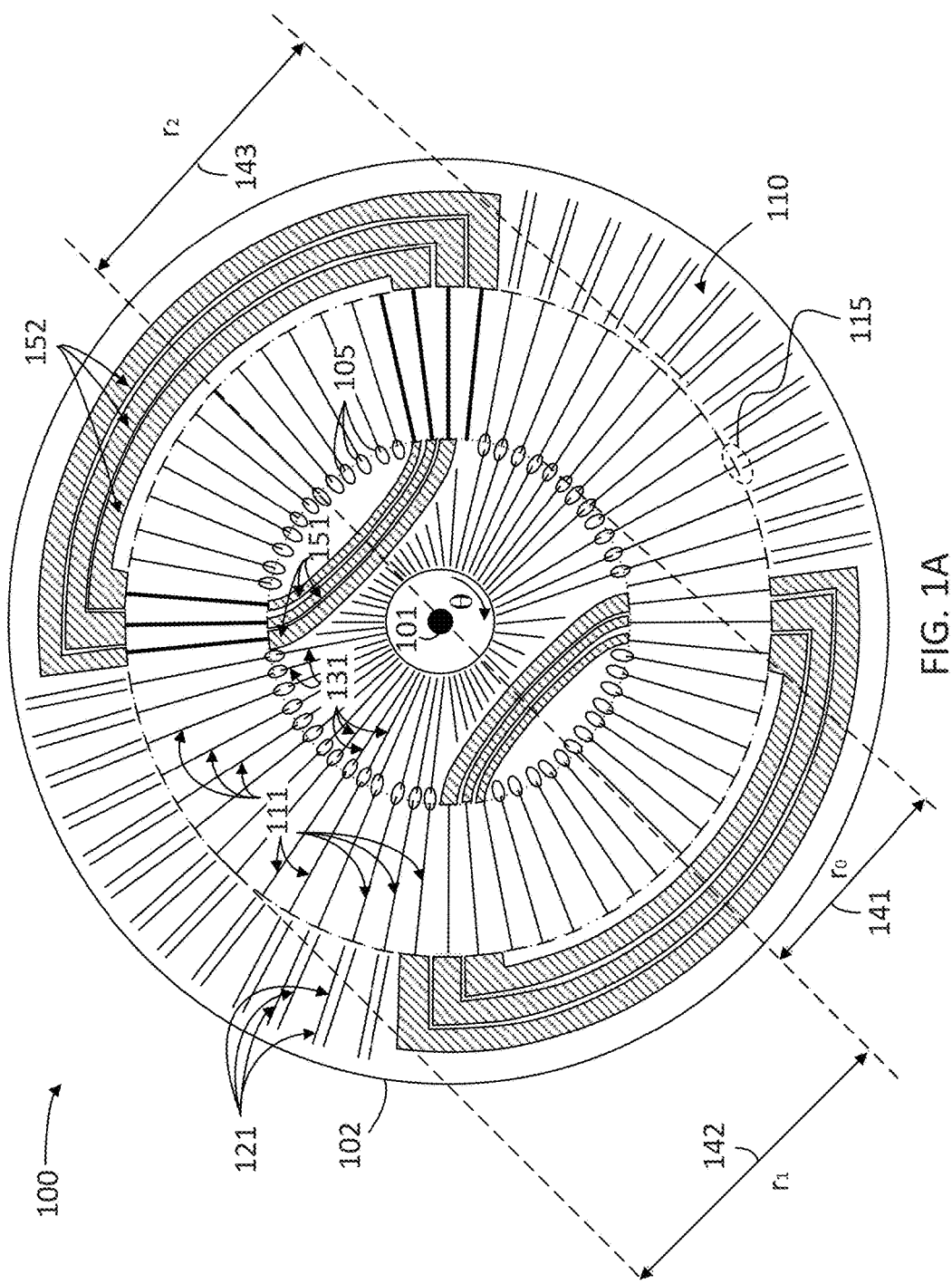
FIG. 1A illustrates a plan view of a stator including a PCS having at least one dielectric layer and a plurality of conductive layers, according to some embodiments.

FIG. 1A illustrates a plan view of a stator 100 including a planar composite structure (PCS) 110 having at least one dielectric layer and a plurality of conductive elements 111, 121, and 131, according to some embodiments. Conductive elements 111, 121 and 131 may be part of a thermal mitigation structure in accordance with an embodiment of the disclosure that can be used at the outer annulus of a PCB structure. PCS 110 is characterized at least in part by a center origin point 101 and a periphery 102. Stator 100 includes a plurality of first conductive elements 111 extending radially to a distance 142 ($r_1$) from center origin point 101 toward periphery 102 of PCS 110 and disposed angularly on the PCS, each first conductive element terminated in a preferred termination structure 115. Further, in some embodiments stator 100 includes a plurality of second conductive elements 121 extending radially from a radius 143 ($r_2$) from center origin point 101 toward periphery 102 and disposed angularly on the PCS. Accordingly, first conductive elements 111 are separated from one another along an angular direction, θ, perpendicular to the radial direction, r, from center origin point 101 to periphery 102. Likewise, second conductive elements 121 are separated from one another along direction, θ. In some embodiments, at least one of the first conductive elements 111 is connected to at least one of the second conductive elements 121 at the preferred termination structure 115, according to a connection configuration.

Stator 100 may include multiple layers similar to the one illustrated in the planar view of FIG. 1A. The multiple layers may be arranged to provide a sequence of coils or windings that are connected, usually in series, to form the poles of a motor or generator. The poles are then typically segregated into groups, with at least one group for each phase of current supplied to the motor (or generated by the generator). Collectively, when properly controlled by an external electric circuit, the arrangement of conductors 111, 151, and 152 in PCS 110 creates a rotating current density and associated magnetic field. This rotating current density (and magnetic field) can exert a torque on a surrounding magnetic structure or current density. The part of the printed circuit board with the radial structures (the "active area") is the part of the stator designed to participate in this interaction. Accordingly, the active area of stator 100 may include conductive elements 111 coupled through conductive elements 151 and 152 to form the rotating current.

Some embodiments include two sets of rare-earth magnets fixed to a shaft passing through a center origin point 101 of PCS 110, which forms a compact, high-efficiency axial field synchronous electric machine. In addition to the active area including a rotating current density that interacts with an inhomogeneous magnetic field, stator 100 may include conductive elements 121 in a peripheral area and conductive elements 131 in an interior area. Accordingly, conductive elements 121 and 131 dissipate heat generated by stator 100, while in operation.

To achieve heat dissipation, some embodiments of stator 100 include preferred termination structures 115 and preferred starting structures 105 on either end of the radially disposed conductive elements 111. Thus, conductive elements 121 in the peripheral area may be coupled to conductive elements 111 through termination structures 115. Conductive elements 131 in the interior area may be coupled to conductive elements 111 through starting structures 105. Structures 105 and 115 include a connection configuration that may be a thermal connection, an electrical connection, or a combination of the two. For example, a thermal connection may be one where there is a physical gap between a conductive element 111 and a conductive element 121, so that there is no electrical connectivity between the two elements. Yet, the proximity of the two disconnected elements 111 and 121 may be sufficient in a thermal configuration to transmit heat efficiently from one conductive element to the other (111 or 121).

Heat is developed in stator 100 by multiple mechanisms. One mechanism is resistive loss in current-carrying conductors. This mechanism contributes power proportion to the square of the current and the effective resistance, i.e., $P_{joule}=I^2R$. The resistance R may be approximately proportional to the feature-width (e.g., in-plane width) as seen in stator 100, since copper thickness and electrical resistivity is generally uniform. In vias, which connect one layer to the next, the copper electrical resistivity is somewhat higher than in the plane. Also, as the frequency of the current increases, it can be necessary to modify the resistance R to include the interaction of the current with its own magnetic field, e.g., the skin depth effect. Practically, this increases the resistance for higher-frequency components of the conducted current, but does not substantively change where the heat is generated on the stator.

A second mechanism of heat generation is related to the interaction of copper (carrying a current or not) with a time-varying magnetic field due to the rotor magnets. For an area A circumscribed by an associated contour C, there is an electric field along the contour such that:

$$\oint_C \vec{E} \cdot d\vec{l} = -\frac{d}{dt} \int_A \vec{B} \cdot d\vec{A}$$

where the direction of the differential area $d\vec{A}$ is related to $d\vec{l}$ by the right hand rule. In a conductive material in the PCS, the electric field leads to eddy-current density and associated losses anywhere there is a time-varying magnetic flux density $\vec{B}$. In general, these eddy currents also influence $\vec{B}$ leading to a magnetic diffusion equation, and a precise calculation of loss must take this into account. This is relevant to the radial active-area traces in the stator assembly, due to the rotating magnetic field that this portion of the stator is exposed to whenever the shaft of the rotor moves. These losses are in addition to any conductivity related losses when the motor is driven by an external circuit, and in fact this loss mechanism exists even if stator 100 is not connected to an external circuit.

A design consideration in stator 100 involves a trade-off between conduction and eddy current losses in the stator active area. To reduce conduction losses, the conductors must be wider (or connected in parallel on subsequent layers). To reduce eddy current losses, the effective areas A capturing time-varying flux must be smaller, thus the conductors must be narrower.

A third heat source involves eddy currents due to magnetic field from current carrying conductors. This effect is important to consider in the inner and outer annulus of the board, where different layers perform different functions. Also, it is important to consider this mechanism in the design of thermal mitigation structures.

The dimensions and proportions of the different elements in stator 100 may vary as desired. In some embodiments, it may be desirable that radius 142 ($r_1$) be equal to radius 143 ($r_2$), resulting in no gap between one or more conductive elements 111 and 121. In other embodiments radius 142 ($r_1$) may be smaller than radius 143 ($r_2$), resulting in a gap between one or more conductive elements 111 and 121. Likewise, the materials forming the different elements in stator 100 may vary as desired, within the scope of the present disclosure. Accordingly, at least one of conductive elements 111, 121, 131, 151, and 152 may include copper, or carbon (e.g., a graphene layer, or a carbon nano-tube layer, or other carbon allotropes), or a copper-carbon composite, or other electrically conductive material or composite. Conductive elements 121, 131 may include thermally conductive material.

Accordingly, in embodiments consistent with the present disclosure conductive elements 111, 121, and 131 act as thermal conductors having reduced areas $d\vec{A}$ for eddy current loss. Additionally, conductive elements 121 may enhance the thickness consistency of stator 100 through the use of laminated copper traces in the peripheral area. Conductive elements 131 are heat removal traces on the inner area of stator 100. In some embodiments, conductive elements 131 may be electrically connected to conductive elements 121 through starting structures 105. Accordingly, starting structures 105 are similar to termination structures 115. However, starting structures 105 are typically radially distributed instead of angularly distributed due to the spatial constraints near center origin point 101.

Figure 1B:
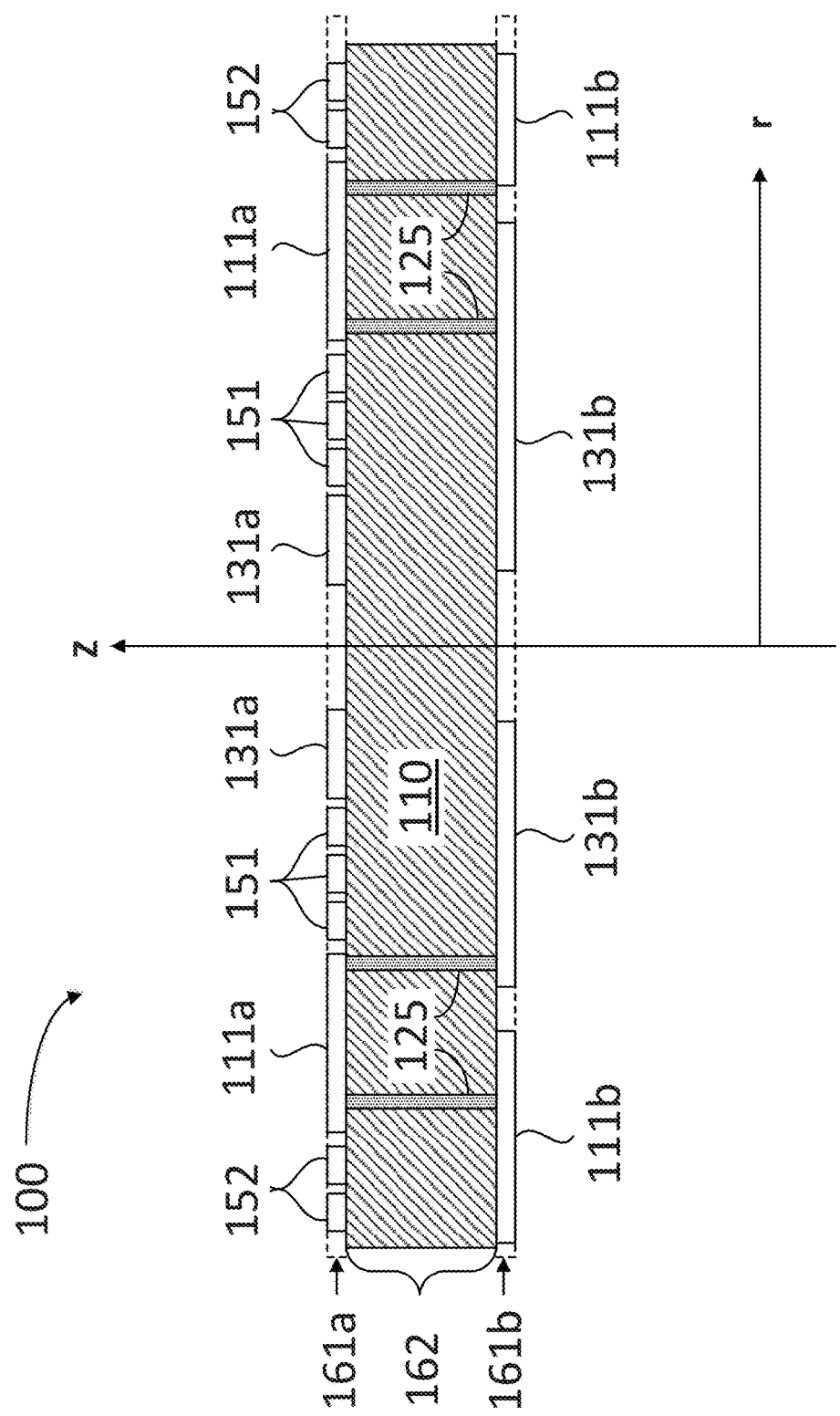
FIG. 1B illustrates a cross-sectional view of a stator, according to some embodiments.

FIG. 1B illustrates a cross-sectional view of stator 100, according to some embodiments. Without limitation and for illustration purposes, a 'Z' axis is shown in the direction of the stacking of the different layers in stator 100, and a perpendicular axis 'r' is shown along its cross-section. As seen, stator 100 may include a dielectric substrate 162 sandwiched between conductive layers 161a and 161b. Vias 125 provide electrical conductivity between conductive layers 161a and 161b. In addition, vias 125 may also provide thermal conductivity between layers 161a and 161b due to the conducting material that is typically used in these elements (e.g., copper, aluminum, tin, tungsten, and derived compounds). Dielectric substrate 162 may include any material used in PCBs, such as a composite material including woven fiberglass with an epoxy resin binder (e.g., FR-4 and the like).

Accordingly, in some embodiments stator 100 includes at least one of conductive elements 111, 121, or 131 (cf. FIG. 1A) located on different conductive layers 161a and 161b. For example, conductive element 111a may be one of the plurality of conductive elements 111 in the active area of stator 100 and disposed on conductive layer 161a. Correspondingly, conductive element 111b may be one of the plurality of conductive elements 111 in the active area of stator 100 and disposed on conductive layer 161b. More generally, conductive elements 121a (cf. FIG. 6A) and 131a correspond to conductive elements 121 and 131, disposed on conductive layer 161a. Likewise, conductive elements 121b (cf. FIG. 6A) and 131b correspond to conductive elements 121 and 131, disposed on conductive layer 161b.

Conductive elements 111, 121 and 131 arranged in multiple conductive layers 161a and 161b may improve heat dissipation in stator 100. Typically, heat is disproportionately conveyed via the electrically conductive elements themselves. For example, the thermal conductivity of copper (at 401 W/(m K)) is almost five hundred (500) times greater than the thermal conductivity of the surrounding dielectric material FR-4 (at 0.81 W/(mK) in-plane). Further, when the heat flows along the Z-direction, copper is even more significant as a heat conducting mechanism, having almost 1,400 times the thermal conductivity of FR-4 in the out-of-plane direction. Note that the overall thermal conductivity of the stator structure depends on the relative areas of the electrically conductive elements and surrounding dielectric.

Figure 2:
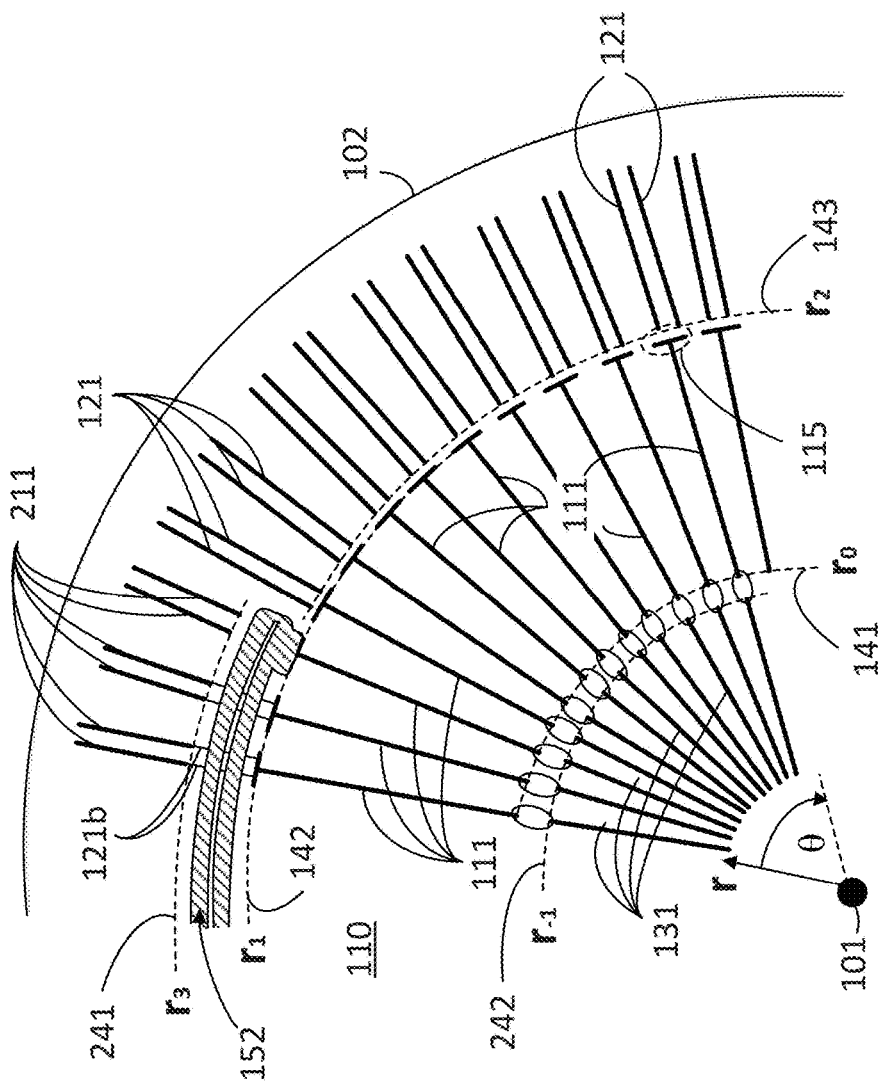
FIG. 2 illustrates a detail of the stator including a plurality of conductive elements disposed radially on the PCS, according to some embodiments.

FIG. 2 illustrates a detail of stator 100 including a plurality of conductive elements 111, 121 and 131, disposed radially on PCS 110, according to some embodiments. And conductive elements 152 disposed angularly on PCS 110. In some embodiments, stator 100 further includes a plurality of third conductive elements 211 extending radially from a radius 241 ($r_3$) from center origin point 101 toward periphery 102 and disposed angularly on PCS 110, wherein at least one of the third conductive elements 211 and at least one of the second conductive elements 121b are coincident and located on different conductive layers. For example, and without loss of generality, conductive elements 211 may be included in conductive layer 161a, and conductive elements 121b may be included in conductive layer 161b.

In some embodiments, thermal coupling between conductive elements 111, 121 and 131 is enhanced significantly by also making an electrical connection between these conductive elements. Accordingly, some embodiments provide clearances between conductive elements 131 and conductive elements 111 in the inner area of stator 100, e.g., to provide space for conductive elements 151. Likewise, some embodiments provide clearances between conductive elements 111 and conductive elements 121 in the peripheral area of stator 100, e.g., to provide space for conductive elements 152. More generally, embodiments of stator 100 consistent with the present disclosure provide electrical clearances between two conducting elements that are at different electric potentials, while still providing good thermal coupling through a small gap of dielectric material separating the two. Moreover, by providing strong thermal connections to different conductive layers through vias, this approach is particularly effective (e.g., vias 125 and conductive layers 162a and 162b, cf. FIG. 1B). Even if a conductive element is interrupted on a first conductive layer, a via section across conductive layers provides heat removal from the first conductive layer to a second conductive layer.

The electrical and thermal coupling between conductive elements 111 and conductive elements 131 includes a starting point of one of conductive elements 111 at a distance 141 ($r_0$) from center origin point 101 contacting starting structure 105. And a starting point of one of conductive elements 131 at a distance 242 ($r_{-1}$) from center origin point 101. The opposite end of conductive element 111 ends on termination structure 115 at a distance 142 ($r_1$) from center origin point 101.

Figure 3:
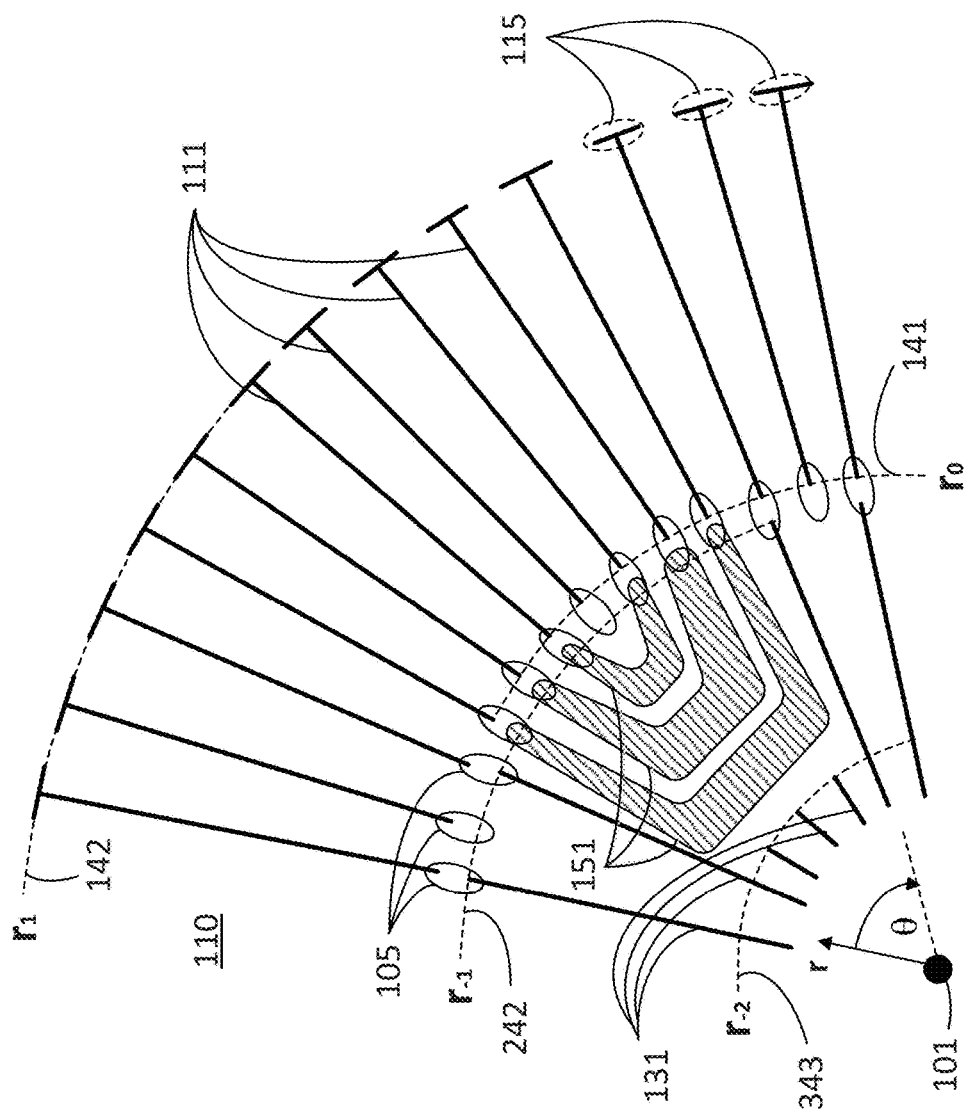
FIG. 3 illustrates a detail of an inner area proximal to a center origin point of a stator, including a plurality of conducting elements disposed radially and angularly on the PCS, according to some embodiments.

FIG. 3 illustrates a detail of an inner area proximal to a center origin point 101 of stator 100, including a plurality of conducting elements 111 and 131 disposed radially and conductive elements 151 disposed angularly on PCS 110, according to some embodiments. Due to the spatial constraints near center origin point 101, in some embodiments only certain conductive elements 131 may be thermally and/or electrically coupled to corresponding conductive elements 111 through a starting structure 105. This arrangement avoids making undesirable electrical contact between adjacent conductive elements 131 near center origin point 101.

Figure 4:
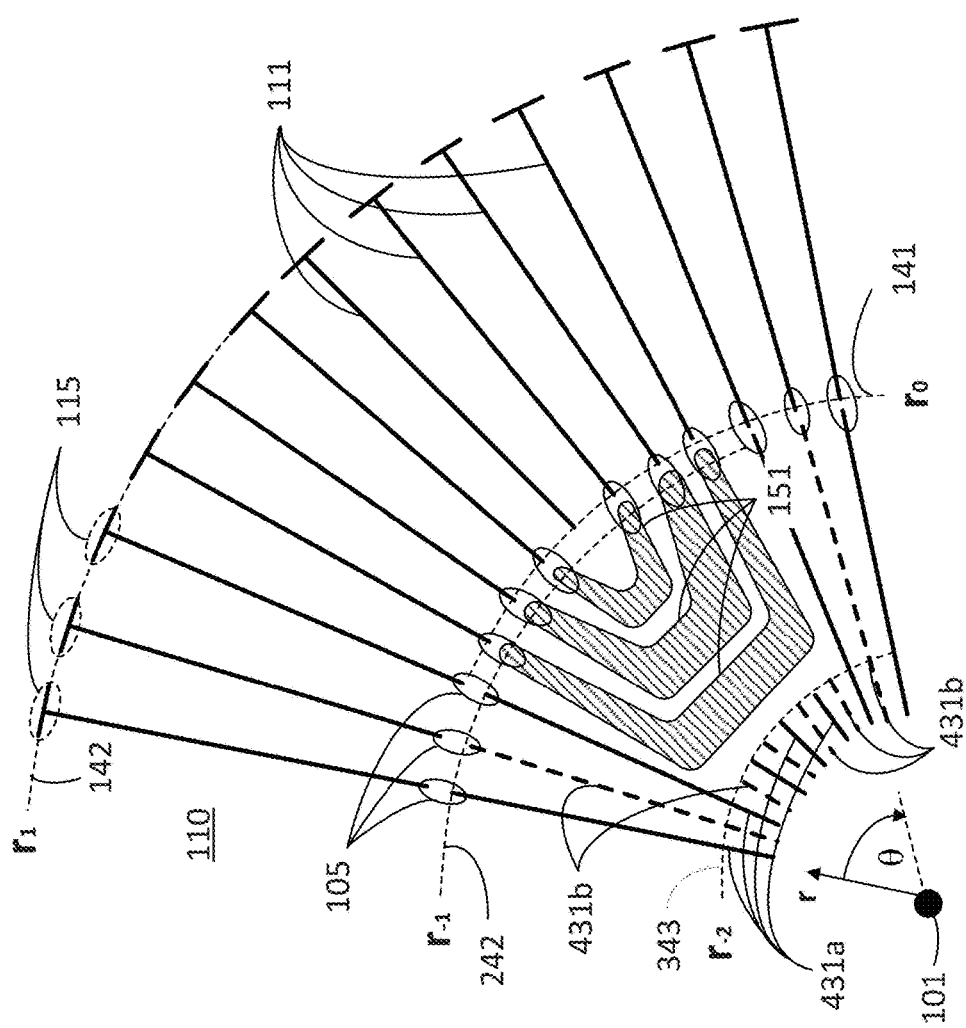
FIG. 4 illustrates a detail of an inner area proximal to a center origin point of a stator, including a plurality of conducting elements disposed radially, angularly, and on different conductive layers on the PCS, according to some embodiments.

FIG. 4 illustrates a detail of an inner area proximal to center origin point 101 of stator 100, including a plurality of conducting elements 111 disposed radially, according to some embodiments. A conductive element 151 is disposed angularly. And conductive elements 431a and 431b are disposed on different conductive layers on the PCS. To address the issue of thermal and electrical conductivity in the highly constrained space of the inner area of PCS 110, conductive elements 431a alternate with conductive elements 431b on different layers of multi-layer PCS 110. Inner vias in starting structures 105 dissipate heat through conductive elements 111. By staggering heat removal traces 431a and 431b in separate conductive layers, they can extend inward while maintaining a desired clearance between adjacent conductive elements on the same conductive layer. Other staggering configurations consistent with this feature may be envisioned, for example connecting every third conductive element 131 through a via block.

Figure 5:
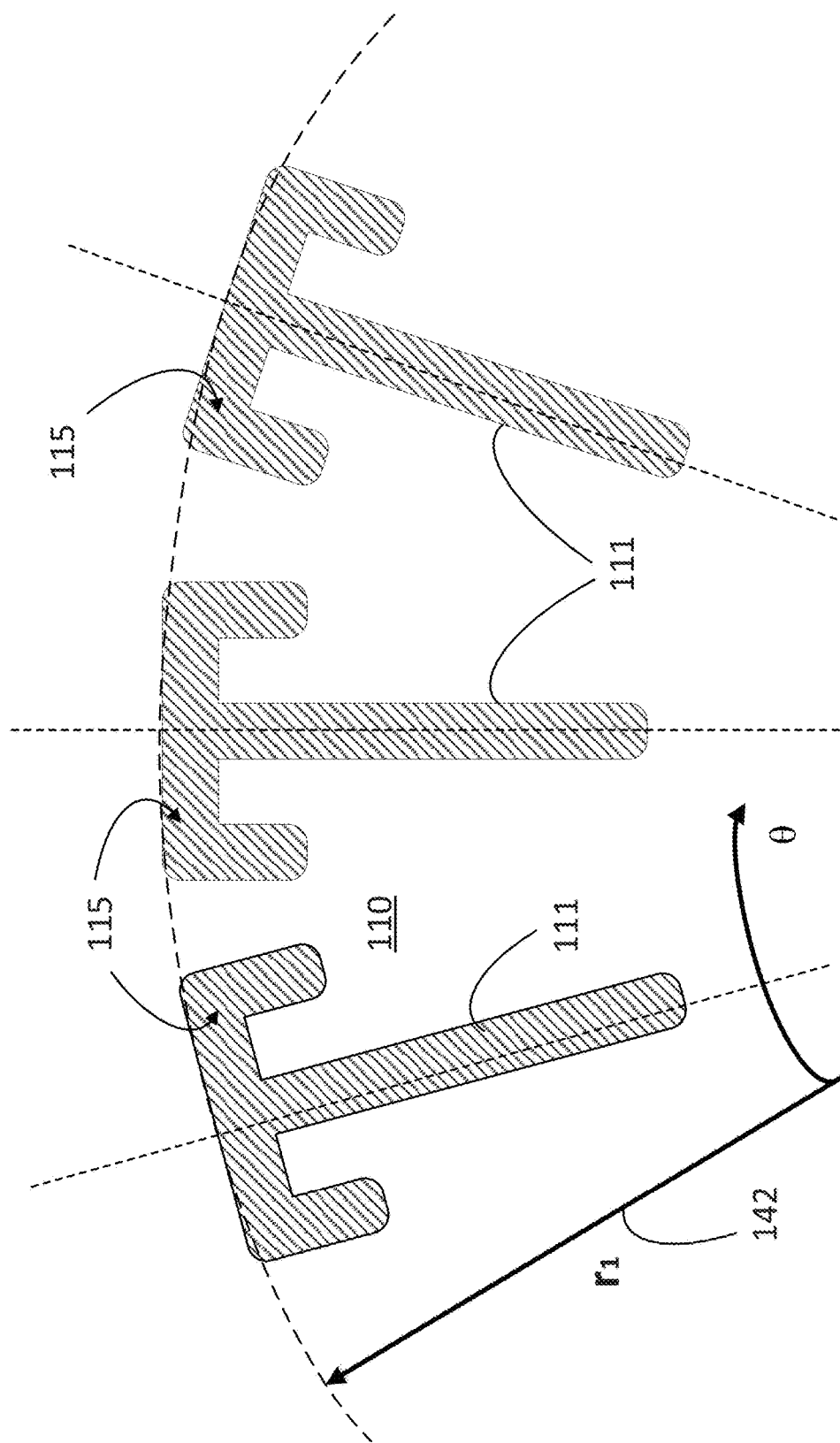
FIG. 5 illustrates a detail of a conductive element including a termination structure, according to some embodiments.

FIG. 5 illustrates a detail of a conductive element 111 including a termination structure 115, according to some embodiments. Termination structure 115 has a T-shaped or "hammerhead" configuration. In some embodiments termination structure 115 may include a square pad instead of a hammerhead configuration. Termination structure 115 improves the angular distribution (i.e., along the θ direction) of heat from different sources in the transition between the active and the peripheral areas of stator 100, such as eddy currents and conductive losses from conducting elements 111 ending at termination structure 115. In addition, termination structure 115 reduces the area wherein losses can occur due to incident time-varying magnetic fields (cf. Eq. 1).

Some embodiments include one or more vias between layers near the outer portions of termination structure 115, which in conjunction with the spatial extent of the hammerhead feature tends to reduce the angular concentration of heat compared to a single-point thermal termination (e.g., starting structure 105, cf. FIG. 1A). The hammerhead feature of termination structure 115 reduces the exposure of solid-copper elements in the peripheral area to time varying magnetic field leakage from the permanent magnet assembly over the active area. The specific dimensions and ratios shown in FIG. 2 may be subject to optimization depending on factors including a desired motor or generator design. Furthermore, the disproportionate ratio of thermal conductivity between the two basic materials in stator 100 (e.g., copper for conductive elements 111, 121, and 131, vs. FR-4 in dielectric substrate 162) suggests that different designs of termination structure 115 that are substantially consistent with stator 100 and termination structure 115, may be equally effective for heat dissipation.

FIGS. 6A-I illustrate details of different connection configurations 615a, 615b, 615c, and 615d (collectively referred hereinafter as connection configurations 615), according to some embodiments. Connection configurations 615 include first conductive elements 111a,b connected to second conductive elements 121a,b at termination structure 115. Termination structure 115 includes vias 125 forming a thermal and electrical coupling between conductive elements 111a,b and conductive elements 121a,b. Three-dimensional axis (Z, r, θ) is consistent with those shown in FIGS. 1A-B, and FIG. 2-4. Axis labeling and specific orientation of the elements in the figures are chosen for illustrative purposes only and should not be deemed limiting the different embodiments depicted.

Figure 6B:
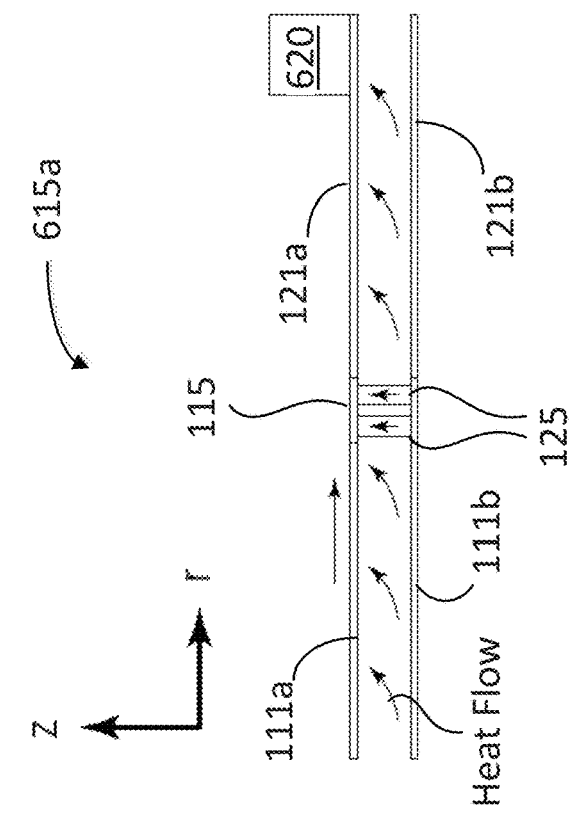
FIGS. 6A-I illustrate details of different connection configurations in a stator, each connection configuration including a first conductive element connected to a second conductive element at a termination structure, according to some embodiments.
Figure 6A:
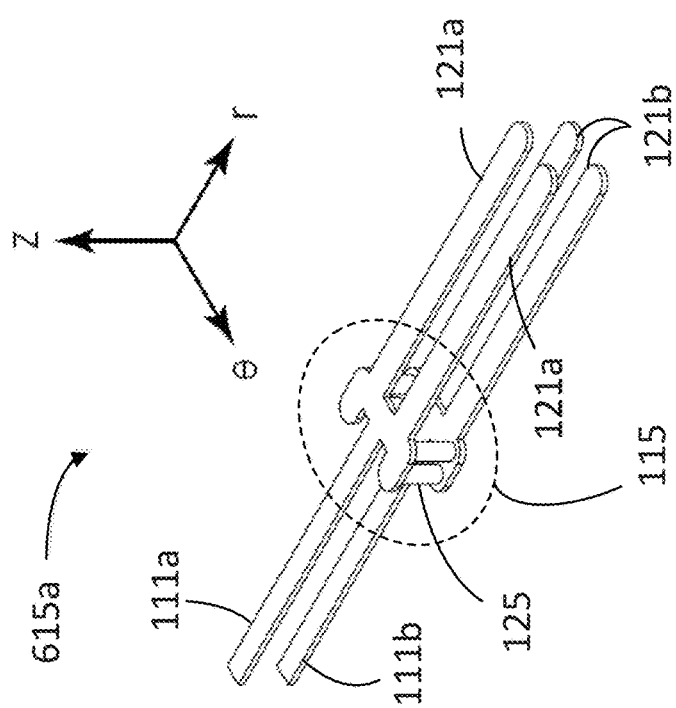

FIG. 6A shows a perspective view of connection configuration 615a, according to some embodiments. Connection configuration 615a includes conductive elements 111a,b and 121a,b in two different conductive layers (e.g., conductive layer 161a and 161b, cf. FIG. 1B), forming an electrical and thermal coupling at termination structure 115. More specifically, connection configuration 615a provides electrical and thermal coupling between conductive elements 111a,b and conductive elements 121a,b.

FIG. 6B is a cross-section view of connection configuration 615a, along the length of conductive elements 111a,b and 121a,b illustrated in FIG. 6A. FIG. 6B also shows schematically the heat flow in connection configuration 615a from conductive elements 111a,b to conductive elements 121a,b and ultimately to heat sink 620. In some embodiments, it is desirable that conductive elements 121a and 121b be at least partially coincident but located in opposite conductive layers of PCS 110. Accordingly, the heat flow from conductive elements 111a,b to conductive elements 121a,b is enhanced along the radial path of conductive elements 111a,b, and 121a,b.

Figure 6C:
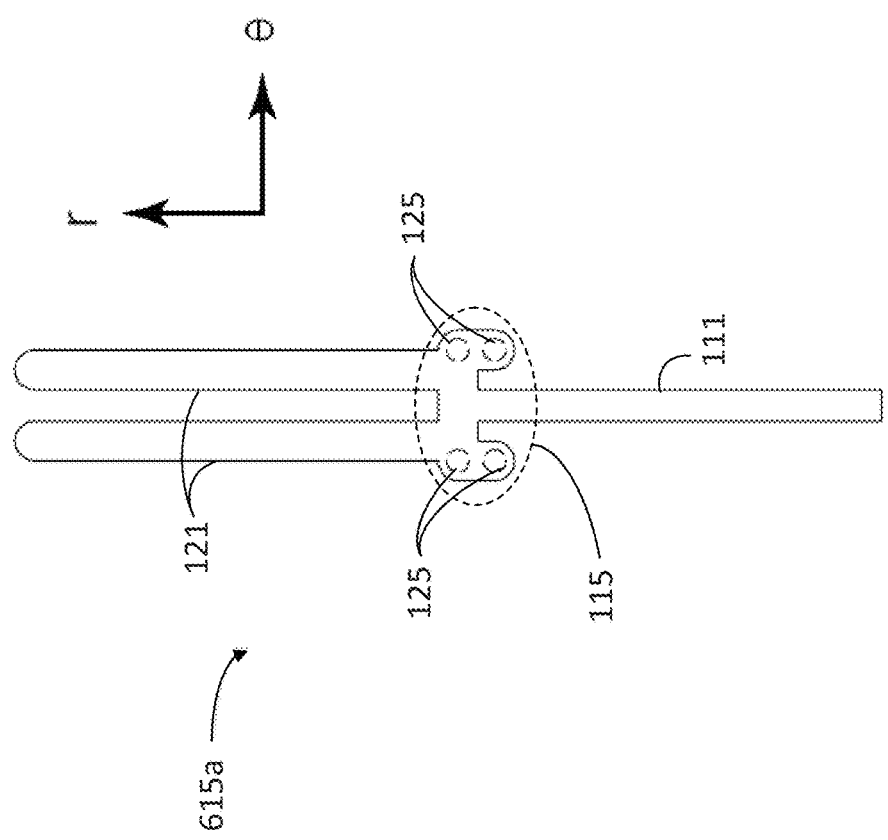

FIG. 6C shows a plan view of connection configuration 615a including conductive elements 111a,b and 121a,b in the same conductive layer, forming an electrical and thermal coupling at termination structure 115. Termination structure 115 includes a hammerhead feature having four (4) vias 125 to provide enhanced heat dissipation and electrical connection between layers.

Figure 6D:
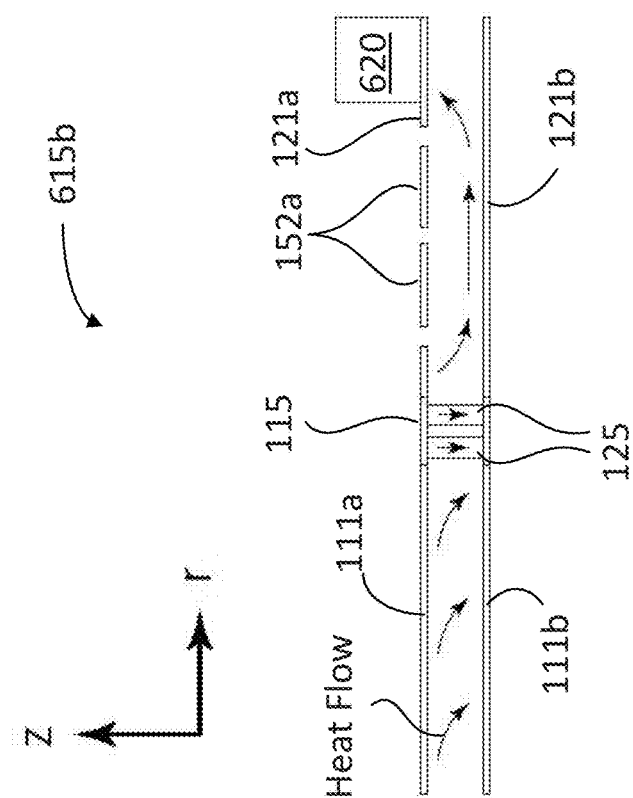

FIG. 6D shows a perspective view of connection configuration 615b including conductive elements 111a,b, 121a,b, and 152a in two different conductive layers, forming an electrical and thermal coupling at termination structure 115. More specifically, connection configuration 615b provides electrical and thermal coupling between conductive elements 111a,b and conductive element 121b through vias 125 in termination structure 115. Further, connection configuration 615b provides thermal coupling between conductive element 111a and conductive element 121a on the same conductive layer, and with no electrical connection between them. Embodiments including connection configuration 615b may be desirable when conductive element 152a operates at a different electrical potential as either one of conductive elements 111a or 121a. Some embodiments including connection configuration 615b may be desirable when conductive element 121a operates at a different electrical potential as conductive element 111a.

Figure 6E:
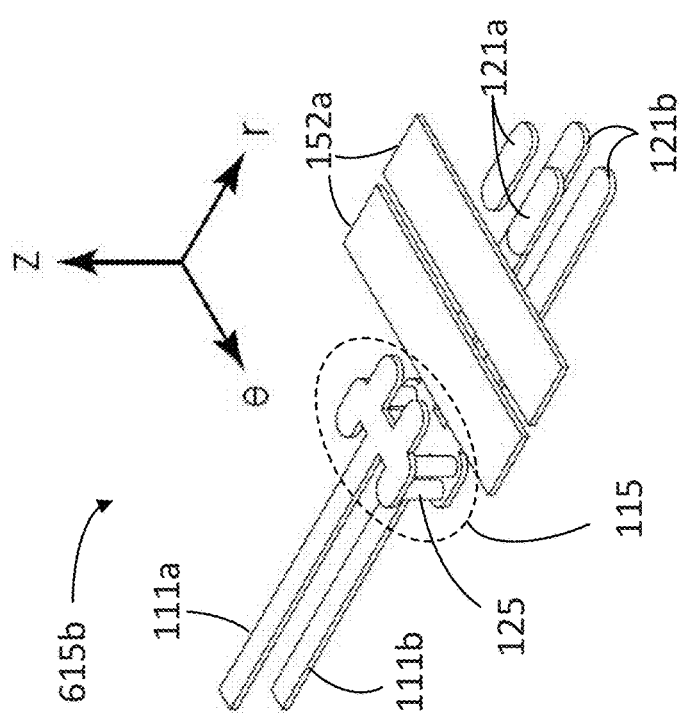

FIG. 6E is a cross-section view of connection configuration 615b along the length of conductive elements 111a,b and 121a,b illustrated in FIG. 6D. FIG. 6E also shows schematically the heat flow from conductive elements 111a,b to conductive elements 121a,b into heat sink 620. Because conductive elements 121a and 121b are at least partially coincident along the plane of PCS 110, heat flows from conductive element 121b to conductive element 121a irrespective of any difference in electrical potential between the two conductive elements.

Figure 6G:
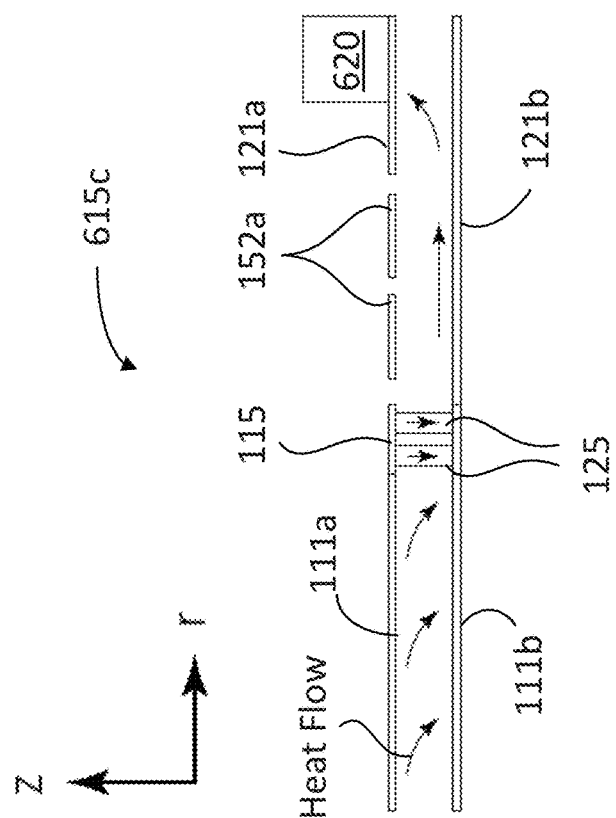
Figure 6F:
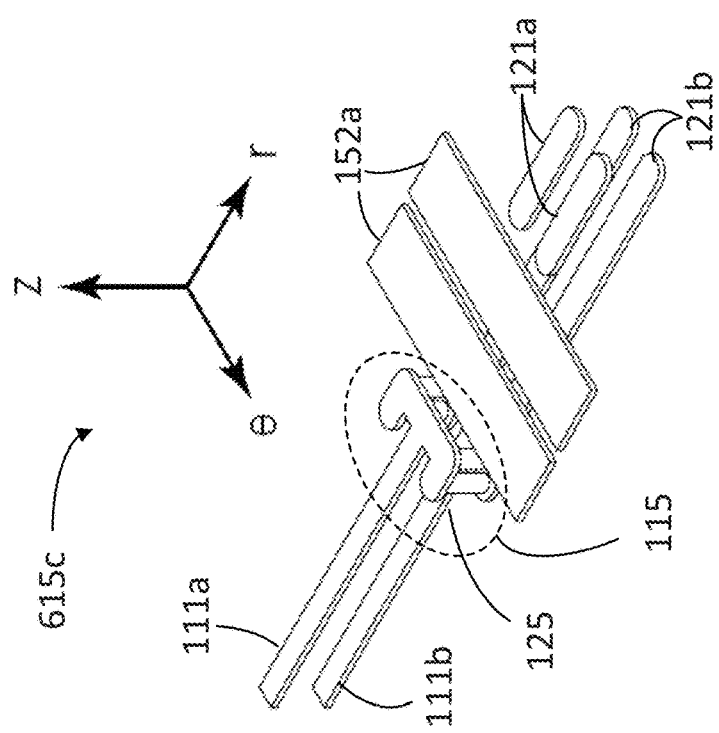

FIG. 6F shows a perspective view of connection configuration 615c including conductive elements 111a,b, 121a,b and 152a in two different conductive layers, and forming an electrical and thermal coupling at termination structure 115. Connection configuration 615c is similar to connection configuration 615b in that conductive elements 111a and 121a are not electrically connected, while conductive elements 111a,b is electrically and thermally connected to conductive element 121b through vias 125 in termination feature 115. However, in connection configuration 615c termination structure 115 has a hammerhead configuration (cf. FIG. 5). Accordingly, the heat flow from conductive elements 111a,b to conductive elements 121a,b in connection configuration 615c is enhanced along the radial path of conductive elements 111a,b, and 121a,b, regardless of the electrical configuration.

FIG. 6G is a cross-section view of connection configuration 615c along the length of conductive elements 111a,b (collectively, 111) and 121a,b (collectively 121) illustrated in FIG. 6F. FIG. 6G also shows schematically the heat flow from conductive elements 111a,b to conductive elements 121a,b into heat sink 620.

Figure 6I:
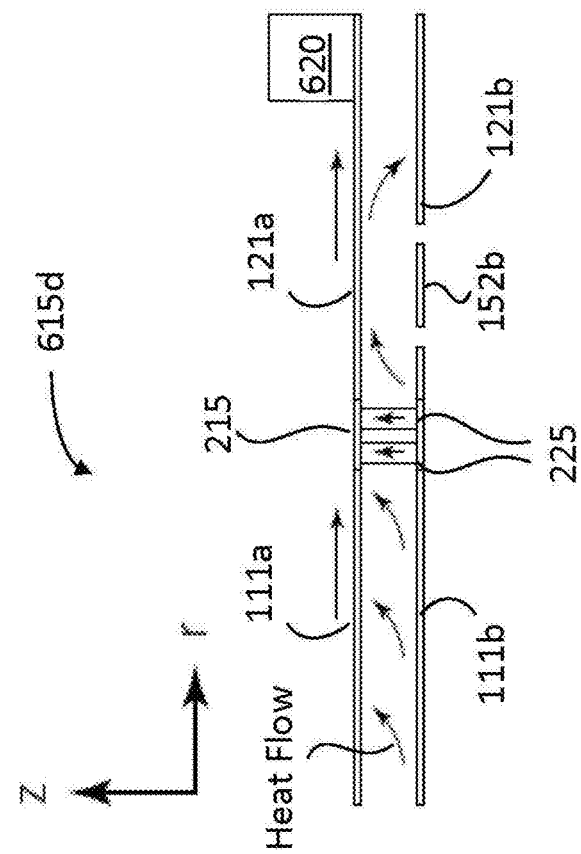
Figure 6H:
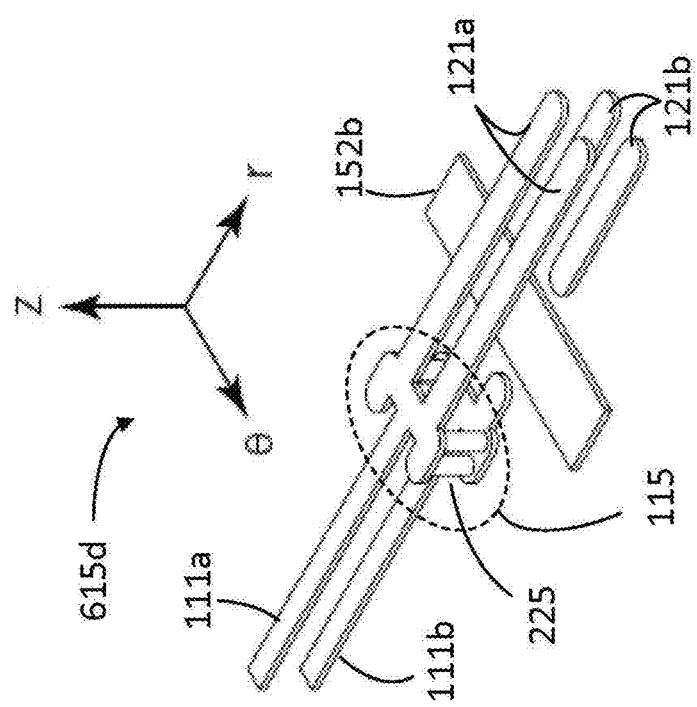

FIG. 6H shows a perspective view of connection configuration 615d including conductive elements 111, 121 and 152b in two different conductive layers, forming an electrical and thermal coupling at termination structure 115. Connection configuration 615d is similar to connection configurations 615b and 615c in that conductive elements in different conductive layers are electrically and thermally connected (i.e., conductive element 111b and conductive element 121a, through vias 125). However, in connection configuration 615d conductive element 152b is disposed on another conductive layer of PCS 110. Accordingly, it may be desirable to electrically isolate conductive element 111b from conductive elements 121b.

FIG. 6I is a cross-section view of connection configuration 615d along the length of conductive elements 111 and 121 illustrated in FIG. 6H. FIG. 6I also shows schematically the heat flow from conductive elements 111a,b to conductive elements 121a,b into heat sink 620. As shown, the heat flow from conductive elements 111a,b to conductive elements 121a,b in connection configuration 615d is enhanced along the radial path of conductive elements 111a,b, and 121a,b, regardless of the electrical configuration.

FIGS. 7A-D illustrate thermal images of stators 700a and 700b (collectively referred hereinafter to as 'stators 700'), respectively, including PCS 110 having at least one dielectric substrate 162 and conductive layers 161a and 161b while dissipating heat, according to some embodiments. Stator 700a does not include conductive elements 111 and 121, while stator 700b does (cf. FIGS. 1A-B). Thermal images are obtained by introducing heat via conduction loss in selected locations on stators 700 to emulate the temperature distribution in an operating motor or generator. Heat sources and sinks in an operating motor or generator include the surrounding magnetic and mechanical components. This approach allows imaging and comparison of thermal performance between different stator designs consistent with embodiments disclosed herein.

Introducing heat via conduction includes configuring a power supply to deliver a fixed amount of power (approximately 20 W) to stators 700 for 10 minutes. Stators 700 were then imaged with a FLIR digital IR camera. Boundary conditions were established by placing stators 700 in an enclosure 750, leaving an exposed half of the stator available for thermal imaging. Additionally, only three of the four corners of PCS 110 were clamped firmly to enclosure 750. This clamping configuration allows a comparison of the efficacy of the thermal designs in removing heat from stators 700 to enclosure 750 with all other conditions held constant. Stators 700 were excited across two of the three wye-connected phases.

Figure 7B:
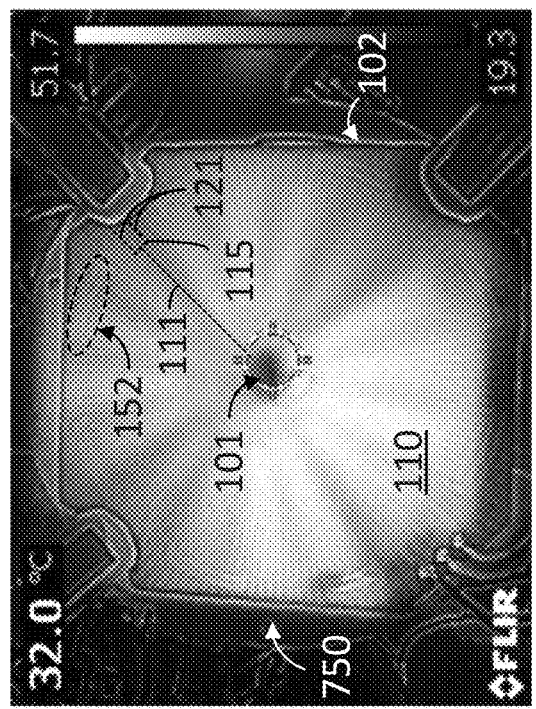
FIGS. 7A-D illustrate thermal images of a stator including a planar composite layer (PCS) having at least one dielectric layer and a plurality of conductive layers while dissipating heat, according to some embodiments.
Figure 7A:
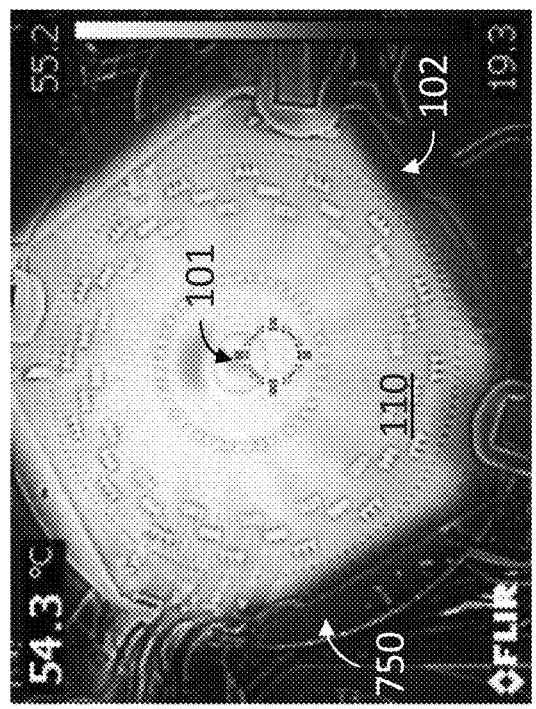

FIG. 7A shows that stator 700a is hotter at the left-hand corner where there is no good thermal contact, the temperature is fairly uniform across stator 700a even where it is well terminated. This suggests that independent of the quality of the heat sinking case, it is difficult to convey heat out of stator 700a.

Figure 7D:
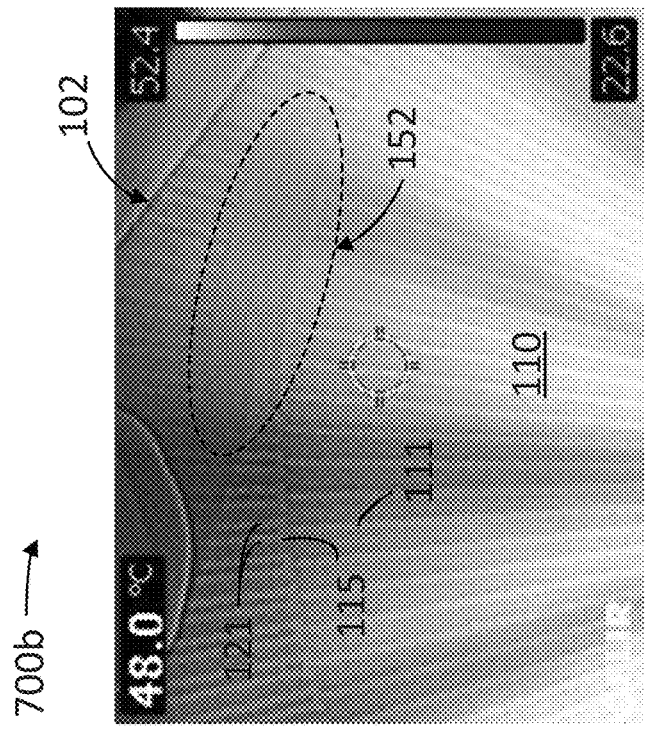
Figure 7D:
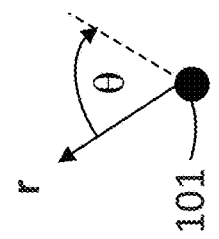
Figure 7C:
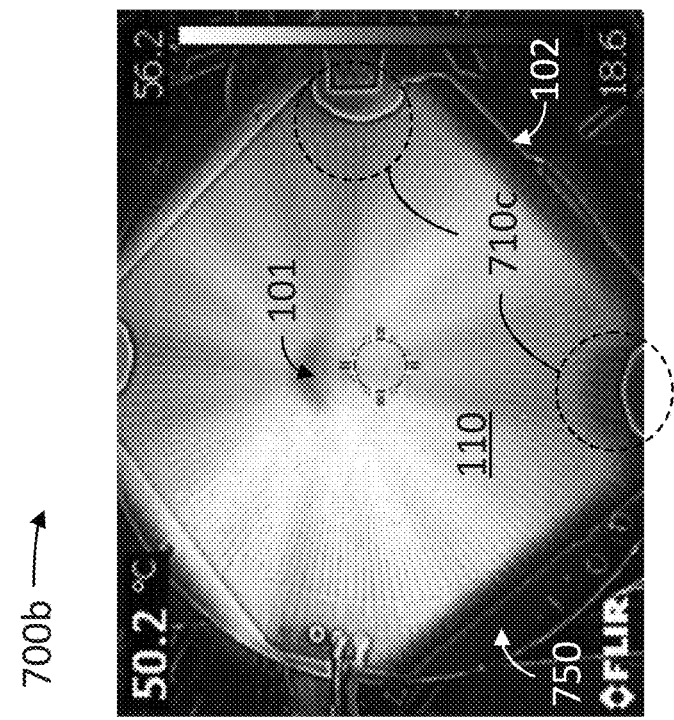

FIGS. 7B-D show the result of the same test and measurement procedure for stator 700b, including conductive elements 111 and 121 as disclosed herein (cf. FIGS. 1A-B, 2-5, and 6A-I). Temperature readings in FIGS. 7A-7D are illustrative only and by no means limiting of embodiments disclosed herein. However, it is revealing that the parts of stator 700b which are clamped to enclosure 750 (darker portions in FIGS. 7B-D) are relatively cooler than the parts with poor thermal termination (brighter portions in FIGS. 7B-D). This suggests that features consistent with embodiments of the present invention are effective in removing heat from stator 700b to enclosure 750.

In FIG. 7C stator 700b shows a distinct pattern between the areas with good thermal termination and the corner with poor thermal termination. However, in this case, the thermal signature of the phases 710c immediately adjacent to the clamp is almost entirely absent.

FIG. 7D shows the effect in FIG. 7C in further detail. Note the difference between the left-portion of the board (well clamped) and the right side (worse contact) and the absence of a sharp gradient in the radial direction (r, towards the sink), relative to the angular direction (θ, as the boundary condition changes). Overall, a comparison the heat-removal efficacy of stator 700a with stator 700b shows that incorporating the features described in one or more of the embodiments of this invention (e.g., conductive elements 111, 121, and 131) can remove heat from the active region (which includes conductive elements 111) with significantly greater efficacy.

Figure 8:
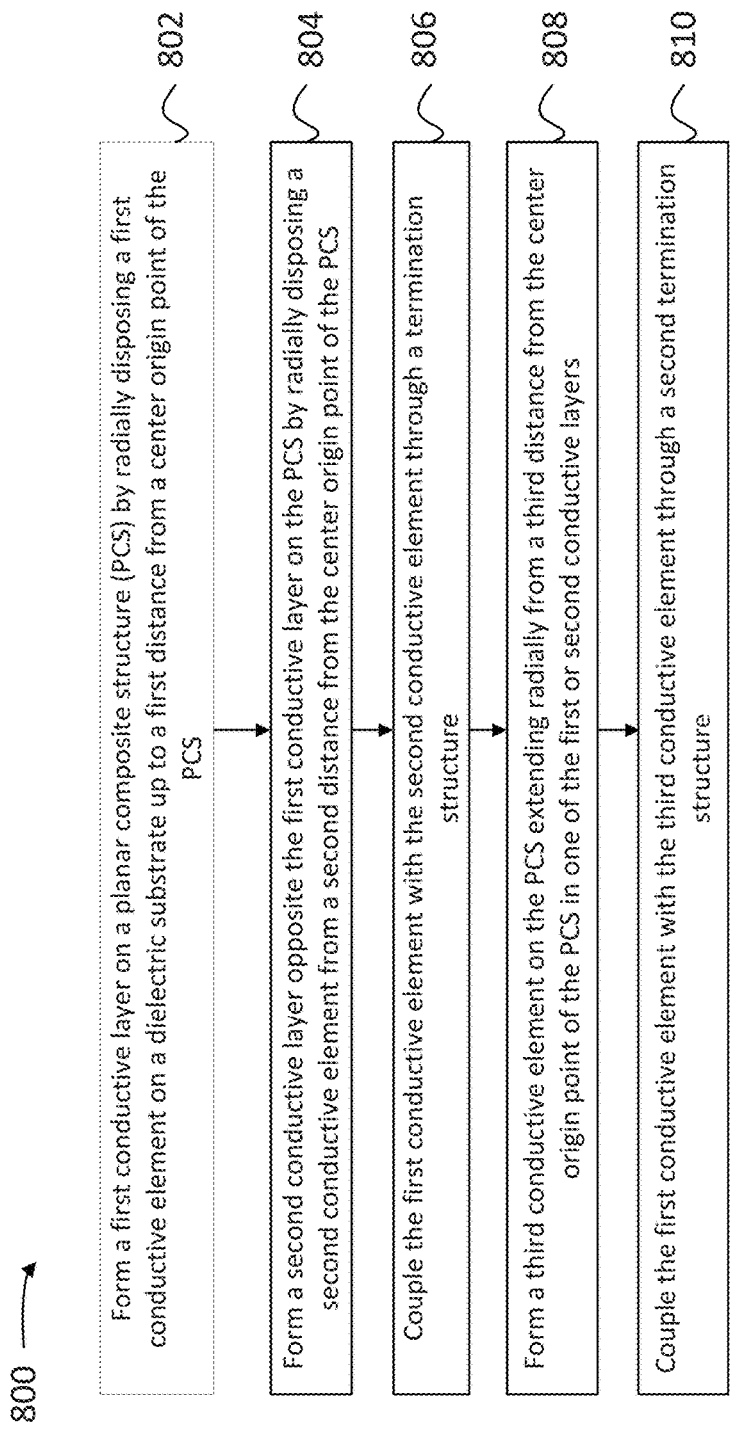
FIG. 8 illustrates a flow chart in a method for manufacturing a stator including a planar composite layer (PCS) having at least one dielectric layer and a plurality of conductive layers, according to some embodiments.

FIG. 8 illustrates a flow chart in a method 800 for manufacturing a stator including a planar composite layer (PCS) having at least one dielectric layer and a plurality of conductive layers, according to some embodiments (e.g., stator 100, PCS 110, dielectric substrate 162, conductive layers 161*a, b*, cf. FIGS. 1A-B through FIG. 6).

Methods consistent with the present disclosure may include at least some, but not all of the steps illustrated in method 800, performed in a different sequence. Furthermore, methods consistent with the present disclosure may include at least two or more steps as in method 800 performed overlapping in time, or almost simultaneously.

Step 802 includes forming a first conductive layer on the PCS by radially disposing a first conductive element on a dielectric substrate up to a first distance from a center origin point of the PCS (e.g., conductive layer 161*a*, dielectric substrate 162, and conductive elements 111, 111*a,b*, cf. FIGS. 1A-B, and FIGS. 4 and 6A-I). Step 804 includes forming a second conductive layer opposite the first conductive layer on the PCS by radially disposing a second conductive element extending radially from a second distance from the center origin point of the PCS (e.g., conductive layer 161*b*, and conductive elements 121, 121*a,b*, 131, 131*a,b*, 211, cf. FIGS. 1A-B, FIG. 2 and FIGS. 4 and 6A-I). Step 806 includes coupling the first conductive element with the second conductive element through a termination structure (e.g., termination structure 115, cf. FIG. 1A). Step 808 includes forming a third conductive element on the PCS extending radially from a third distance from the center origin point of the PCS in one of the first or second conductive layers (e.g., conductive elements 121, 121*a,b*, 131, 131*a,b*, 211, cf FIGS. 1A-B, FIG. 2 and FIGS. 4 and 6A-I). Step 810 includes coupling the first conductive element with the third conductive element through a second termination structure (e.g., termination structures 105 or 115, cf. FIG. 1A).

In some embodiments, coupling the first conductive element with the second or third conductive elements may include any one of a thermal coupling, an electrical coupling, or both. Furthermore, the coupling may include a connection configuration having starting and/or termination structures including vias that go through the dielectric substrate from one conductive layer to another conductive layer (e.g., vias 125 and connection configurations 615, cf FIGS. 6A-I). In some embodiments, the first conductive element is in an active area of the PCS and least one of the second or third conductive elements is in an inner area of the PCS. Accordingly, the termination structure may be radially oriented on the PCS due to spatial constraints (e.g., termination structure 105). In some embodiments, when the second or third conductive element is in a peripheral area of the PCS, the termination structure may be angularly oriented on the PCS (e.g., termination structure 115).

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A planar composite structure (PCS) configured for use as a stator of an axial flux motor or generator, the PCS comprising:
   at least one dielectric layer;
   first elongated conductive elements arranged angularly on the at least one dielectric layer, each of the first elongated conductive elements extending radially between a first radial distance from an origin point associated with the at least dielectric layer and a second radial distance from the origin point, wherein the second radial distance is greater than the first radial distance;
   conductive inner end turns disposed on the at least one dielectric layer, each of the conductive inner end turns being connected between portions of at least two of the first elongated conductive elements at the first radial distance;
   conductive outer end turns disposed on the at least one dielectric layer, each of the conductive outer end turns being connected between portions of at least two of the first elongated conductive elements at the second radial distance; and
   at least one second elongated conductive element disposed on the at least one dielectric layer, the at least one second elongated conductive element extending radially between a third radial distance from the origin point and a fourth radial distance from the origin point, wherein:
      the fourth radial distance is greater than the third radial distance,
      either (a) the fourth radial distance is less than the first radial distance, or (b) the third radial distance is greater than the second radial distance, and
      the at least one second elongated conductive element is thermally connected to at least a first one of the first elongated conductive elements without the at least one second elongated conductive element also being electrically connected to the first one of the first elongated conductive elements.

2. The PCS of claim 1, further comprising at least one third elongated conductive element disposed on the at least one dielectric layer, wherein the at least one third elongated conductive element:
   is on an opposite side of the at least one dielectric layer as the at least one second elongated conductive element;
   extends along at least a portion of a length of the at least one second elongated conductive element so as to establish a thermal connection between the at least one third elongated conductive element and the at least one second elongated conductive element by the at least one dielectric layer; and
   is thermally connected to the first one of the first elongated conductive elements.

3. The PCS of claim 2, wherein the third radial distance is greater than the second radial distance.

4. The PCS of claim 2, wherein the fourth radial distance is less than the first radial distance.

5. The PCS of claim 1, wherein the third radial distance is greater than the second radial distance.

6. The PCS of claim 1, wherein the fourth radial distance is less than the first radial distance.

7. A planar composite structure (PCS) configured for use as a stator of an axial flux motor or generator, the PCS comprising:
   at least one dielectric layer;
   first elongated conductive elements arranged angularly on the at least one dielectric layer, each of the first elongated conductive elements extending radially between a first radial distance from an origin point associated with the at least one dielectric layer and a second radial distance from the origin point, wherein the second radial distance is greater than the first radial distance, a first one of the first elongated conductive elements being disposed on a first surface of the at least one dielectric layer, and a second one of the first elongated conductive elements being disposed on a second surface of the at least one dielectric layer opposite the first surface;

conductive inner end turns disposed on the at least one dielectric layer, each of the conductive inner end turns being connected between portions of at least two of the first elongated conductive elements at the first radial distance;

conductive outer end turns disposed on the at least one dielectric layer, each of the conductive outer end turns being connected between portions of at least two of the first elongated conductive elements at the second radial distance;

a second conductive element disposed on the first surface, a first portion of the second conductive element being connected to a first portion of the first one of the first elongated conductive elements at the second radial distance; and a first via extending through the at least one dielectric layer, wherein the first via:
- is angularly offset from the first portion of the first one of the first elongated conductive elements, and
- electrically interconnects the first one of the first elongated conductive elements and the second one of the first elongated conductive elements through at least the second conductive element.

8. The PCS of claim 7, further comprising:

a first outer elongated conductive element disposed on the at least one dielectric layer and extending radially between a third radial distance from the origin point and a fourth radial distance from the origin point, wherein:
- the fourth radial distance is greater than the third radial distance,
- the third radial distance is greater than the second radial distance, and
- the first outer elongated conductive elements is thermally connected to the first one of the first elongated conductive elements.

9. The PCS of claim 8, further comprising:

a second outer elongated conductive element disposed on the at least one dielectric layer and extending radially between the third radial distance and the fourth radial distance, wherein:
- the first outer elongated conductive element is not electrically connected to the first one of the first elongated conductive elements,
- the second outer elongated conductive element is on an opposite side of the at least one dielectric layer as the first outer elongated conductive element,
- the second outer elongated conductive element extends along at least a portion of a length of the first outer elongated conductive element so as to establish a thermal connection between the second outer elongated conductive element and the first outer elongated conductive element by the at least one dielectric layer, and
- the second outer elongated conductive elements is thermally connected to the first one of the first elongated conductive elements through the first via.

10. The PCS of claim 7, wherein the first via is angularly offset in a first direction from the first portion of the first one of the first elongated conductive elements, and the PCS further comprises a second via extending through the at least one dielectric layer, wherein the second via:
- is angularly offset in a second direction from the first portion of the first one of the first elongated conductive elements, the second direction being opposite the first direction, and
- electrically interconnects the first one of the first elongated conductive elements and the second one of the first elongated conductive elements through at least the second conductive element.

11. The PCS of claim 10, further comprising:

first and second outer elongated conductive elements disposed on the at least one dielectric layer and each extending radially between a third radial distance from the origin point and a fourth radial distance from the origin point, wherein:
- the fourth radial distance is greater than the third radial distance,
- the third radial distance is greater than the second radial distance, and
- each of the first and second outer elongated conductive elements is thermally connected to the first one of the first elongated conductive elements.

12. The PCS of claim 11, further comprising:

third and fourth outer elongated conductive elements disposed on the at least one dielectric layer and each extending radially between the third radial distance and the fourth radial distance, wherein:
- neither of the first and second outer elongated conductive elements is electrically connected to the first one of the first elongated conductive elements,
- the third and fourth outer elongated conductive elements are on an opposite side of the at least one dielectric layer as the first and second outer elongated conductive elements,
- the third outer elongated conductive element extends along at least a portion of a length of the first outer elongated conductive element so as to establish a thermal connection between the third outer elongated conductive element and the first outer elongated conductive element by the at least one dielectric layer,
- the fourth outer elongated conductive element extends along at least a portion of a length of the second outer elongated conductive element so as to establish a thermal connection between the fourth outer elongated conductive element and the second outer elongated conductive element by the at least one dielectric layer,
- the third outer elongated conductive elements is thermally connected to the first one of the first elongated conductive elements through the first via, and
- the fourth outer elongated conductive elements is thermally connected to the first one of the first elongated conductive elements through the second via.

13. The PCS of claim 12, wherein the first and second outer elongated conductive elements are disposed on a same surface of the at least one dielectric layer.

14. The PCS of claim 11, wherein the first and second outer elongated conductive elements are disposed on a same surface of the at least one dielectric layer.

15. A planar composite structure (PCS) configured for use as a stator of an axial flux motor or generator, the PCS comprising:
- at least one dielectric layer;
- first elongated conductive elements arranged angularly on the at least one dielectric layer, each of the first elongated conductive elements extending radially between a first radial distance from an origin point associated with the at least dielectric layer and a second radial distance from the origin point, wherein the second radial distance is greater than the first radial distance;
- conductive inner end turns disposed on the at least one dielectric layer, each of the conductive inner end turns being connected between portions of at least two of the first elongated conductive elements at the first radial distance;
- conductive outer end turns disposed on the at least one dielectric layer, each of the conductive outer end turns being connected between portions of at least two of the first elongated conductive elements at the second radial distance; and
- first and second outer elongated conductive elements disposed on the at least one dielectric layer and each extending radially between a third radial distance from the origin point and a fourth radial distance from the origin point, wherein:
  - the fourth radial distance is greater than the third radial distance,
  - the third radial distance is greater than the second radial distance, and
  - each of the first and second outer elongated conductive elements is thermally connected to a first one of the first elongated conductive elements.

16. The PCS of claim 15, wherein the first and second outer elongated conductive elements are disposed on a same surface of the at least one dielectric layer.

17. The PCS of claim 15, wherein at least one of the first and second outer elongated conductive elements is angularly offset from the first one of the first elongated conductive elements.

18. The PCS of claim 15, further comprising:
- third and fourth outer elongated conductive elements disposed on the at least one dielectric layer and each extending radially between the third radial distance and the fourth radial distance, wherein:
  - neither of the first and second outer elongated conductive elements is electrically connected to the first one of the first elongated conductive elements,
  - the third and fourth outer elongated conductive elements are on an opposite side of the at least one dielectric layer as the first and second outer elongated conductive elements,
  - the third outer elongated conductive element extends along at least a portion of a length of the first outer elongated conductive element so as to establish a thermal connection between the third outer elongated conductive element and the first outer elongated conductive element by the at least one dielectric layer,
  - the fourth outer elongated conductive element extends along at least a portion of a length of the second outer elongated conductive element so as to establish a thermal connection between the fourth outer elongated conductive element and the second outer elongated conductive element by the at least one dielectric layer,
  - the third outer elongated conductive elements is thermally connected to the first one of the first elongated conductive elements through a first via, and
  - the fourth outer elongated conductive elements is thermally connected to the first one of the first elongated conductive elements through a second via.

19. The PCS of claim 18, wherein the first and second outer elongated conductive elements are disposed on a same surface of the at least one dielectric layer.

20. The PCS of claim 18, wherein at least one of the first and second outer elongated conductive elements is angularly offset from the first one of the first elongated conductive elements.

* * * * *